(12) United States Patent
Chen et al.

(10) Patent No.: US 8,143,126 B2
(45) Date of Patent: Mar. 27, 2012

(54) METHOD FOR FORMING A VERTICAL MOS TRANSISTOR

(75) Inventors: Jingjing Chen, Beijing (CN); Ganming Qin, Chandler, AZ (US); Edouard D. de Fresart, Tempe, AZ (US); Pon Sung Ku, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 78 days.

(21) Appl. No.: 12/777,066

(22) Filed: May 10, 2010

(65) Prior Publication Data

US 2011/0275187 A1 Nov. 10, 2011

(51) Int. Cl.
*H01L 21/336* (2006.01)

(52) U.S. Cl. ................. 438/270; 438/589; 257/E21.417

(58) Field of Classification Search .......... 438/268–270, 438/589; 257/E21.417
See application file for complete search history.

(56) References Cited

U.S. PATENT DOCUMENTS

| | | | |
|---|---|---|---|
| 5,229,310 A | 7/1993 | Sivan | |
| 5,614,749 A | 3/1997 | Ueno | |
| 5,669,615 A | 9/1997 | Hohe et al. | |
| 5,844,273 A | 12/1998 | Konishi | |
| 6,184,086 B1 * | 2/2001 | Kao | 438/259 |
| 6,316,806 B1 | 11/2001 | Mo | |
| 6,924,198 B2 | 8/2005 | Williams et al. | |
| 7,049,668 B1 | 5/2006 | Hshieh | |
| 7,075,145 B2 | 7/2006 | Williams et al. | |
| 7,348,244 B2 | 3/2008 | Aoki et al. | |
| 7,354,829 B2 | 4/2008 | Aoki et al. | |
| 7,622,768 B2 | 11/2009 | Aoki et al. | |
| 2005/0070081 A1 * | 3/2005 | Shibata | 438/589 |
| 2005/0167742 A1 | 8/2005 | Challa et al. | |
| 2005/0196947 A1 * | 9/2005 | Seo et al. | 438/589 |
| 2005/0236664 A1 | 10/2005 | Aoki et al. | |
| 2006/0273351 A1 | 12/2006 | Ozoe et al. | |
| 2007/0093077 A1 | 4/2007 | Grivna | |
| 2008/0057649 A1 | 3/2008 | Schuele et al. | |
| 2008/0246088 A1 | 10/2008 | Schuele et al. | |

* cited by examiner

*Primary Examiner* — Richard A. Booth
(74) *Attorney, Agent, or Firm* — Joanna G. Chiu; James L. Clingan, Jr.

(57) ABSTRACT

A method is used to form a vertical MOS transistor. The method utilizes a semiconductor layer. An opening is etched in the semiconductor layer. A gate dielectric is formed in the opening that has a vertical portion that extends to a top surface of the first semiconductor layer. A gate is formed in the opening having a major portion laterally adjacent to the vertical portion of the gate dielectric and an overhang portion that extends laterally over the vertical portion of the gate dielectric. An implant is performed to form a source region at the top surface of the semiconductor layer while the overhang portion is present.

18 Claims, 11 Drawing Sheets

METHOD FOR FORMING A VERTICAL MOS TRANSISTOR

BACKGROUND

1. Field

This disclosure relates generally to semiconductor processing, and more specifically, to a method for forming a vertical MOS transistor.

2. Related Art

In a vertical MOS transistor, trenches are formed in a semiconductor layer and lined with an insulator material. These trenches are then filled with a gate material. Therefore, a channel region of the vertical MOS transistor lies along the vertical wall of the trench. One application of a vertical MOS transistor is a power transistor which is capable of handling large currents. In some applications, a vertical MOS transistor is required to sustain strenuous performance standards under short-circuit conditions and sustain several millions of cycles under short-circuit conditions, such as, for example, in automotive applications. Therefore, it is desirable to provide a vertical MOS transistor with improved device robustness and energy capability.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, a vertical MOS transistor (which may also be referred to as a trench MOS transistor) is formed in an opening (which may also be referred to as a trench) within a semiconductor layer. A gate dielectric of the vertical MOS transistor formed within the opening has a vertical portion that extends along a sidewall of the opening. A gate of the vertical MOS transistor formed within the opening includes an overhang portion that extends laterally over the vertical portion of the gate dielectric. With this overhang present, an implant is performed to form a source region of the vertical MOS transistor. Therefore, this overhang acts as a mask to prevent this implant from going into the gate dielectric. In this manner, the integrity of the gate dielectric may be improved. Furthermore, by reducing the amount of charge which enters the gate dielectric during the source implant, then, due to the segregation and diffusion effects, a shallower source region results as compared to the source regions in typical trench transistors.

Figure 1:
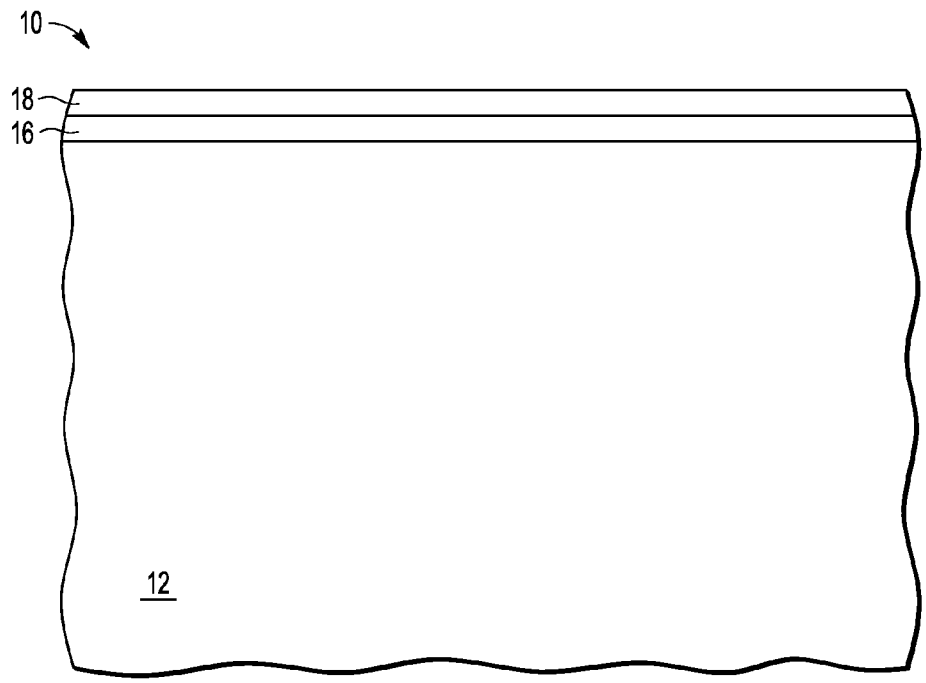
FIG. 1 illustrates, in cross-sectional form, a semiconductor device having first insulating layer over a semiconductor layer, and having a second insulating layer over the first insulating layer, in accordance with one embodiment of the present invention.

FIG. 1 illustrates, in cross-sectional form, a semiconductor device 10 having an insulating layer 16 over a semiconductor layer 12, and having an insulating layer 18 over insulating layer 16, in accordance with one embodiment of the present invention. In one embodiment, semiconductor layer 12 can be any semiconductor material or combinations of materials, such as gallium arsenide, silicon germanium, silicon-on-insulator (SOI), silicon, monocrystalline silicon, the like, and combinations of the above. Also, semiconductor layer 12 may also be referred to as a semiconductor substrate. In one embodiment, insulating layer 16 is an oxide which is grown on semiconductor layer 12 and has a first etch characteristic.

In one embodiment, insulating layer 18 is a nitride layer which is deposited over insulating layer 16.

Figure 2:
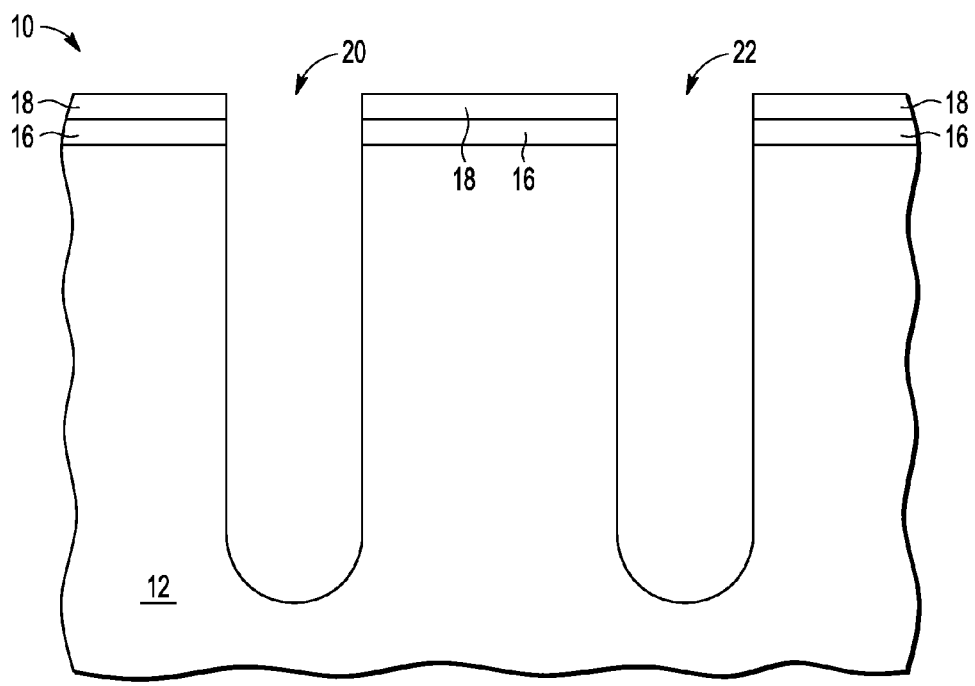
FIG. 2 illustrates, in cross-sectional form, the semiconductor device of FIG. 1 having openings formed in the semiconductor layer, in accordance with one embodiment of the present invention.

FIG. 2 illustrates, in cross-sectional form, semiconductor device 10 after formation of openings 20 and 22 in semiconductor layer 12, in accordance with one embodiment of the present invention. In one embodiment, a patterned masking layer is formed over insulating layer 18 having openings corresponding to the location of openings 20 and 22. Insulating layers 16 and 18 and semiconductor layer 12 are then etched, using the patterned masking layer, to form openings 20 and 22. Note that openings 20 and 22 may also be referred to as trenches and may have any length along the surface of semiconductor layer 12, as needed. (This is not apparent from the cross-sectional view in the FIGs. since the length of the trench extends into and/or out of the paper, in a direction perpendicular to the surface of the paper.) As will be described below, openings 20 and 22 will be used to form one or more vertical MOS transistors.

Figure 3:
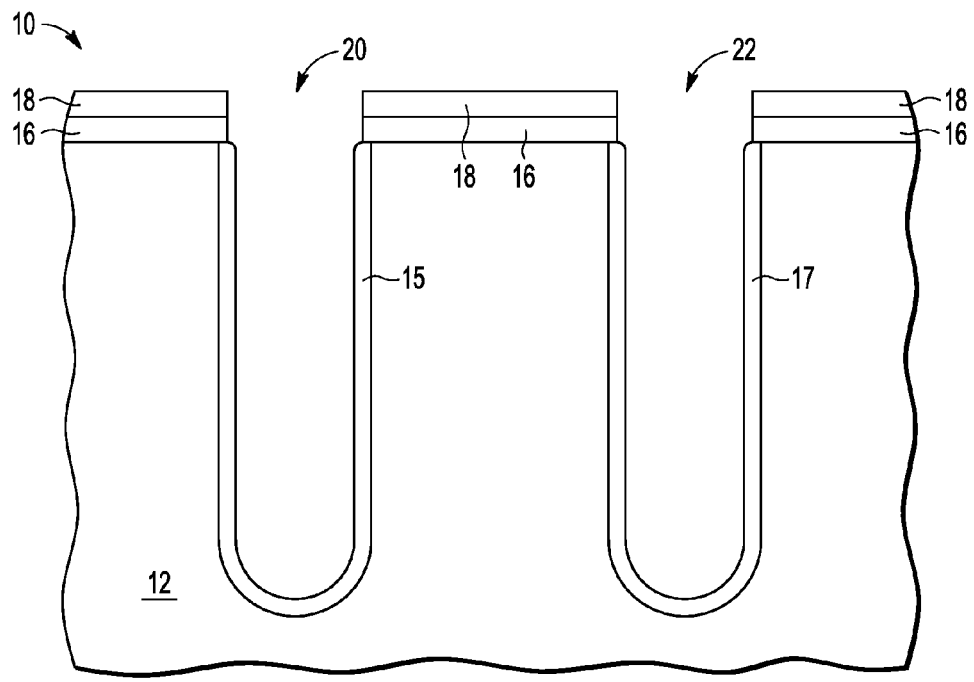
FIG. 3 illustrates, in cross-sectional form, the semiconductor device of FIG. 2 having a sacrificial insulating layer formed within the trenches, in accordance with one embodiment of the present invention.

FIG. 3 illustrates, in cross-sectional form, semiconductor device 10 of FIG. 2 after formation of sacrificial insulating layers 15 and 17 within openings 20 and 22, respectively, in accordance with one embodiment of the present invention. In one embodiment, each of sacrificial insulating layers 15 and 17 are grown within openings 20 and 22, respectively, and therefore consume a portion of semiconductor layer 12 along the walls and bottom of the openings. In one embodiment, each of insulating layers 15 and 17 have the same first etch characteristic as insulating layer 16. In one embodiment, this first etch characteristic is different from an etch characteristic of insulating layer 18.

Figure 4:
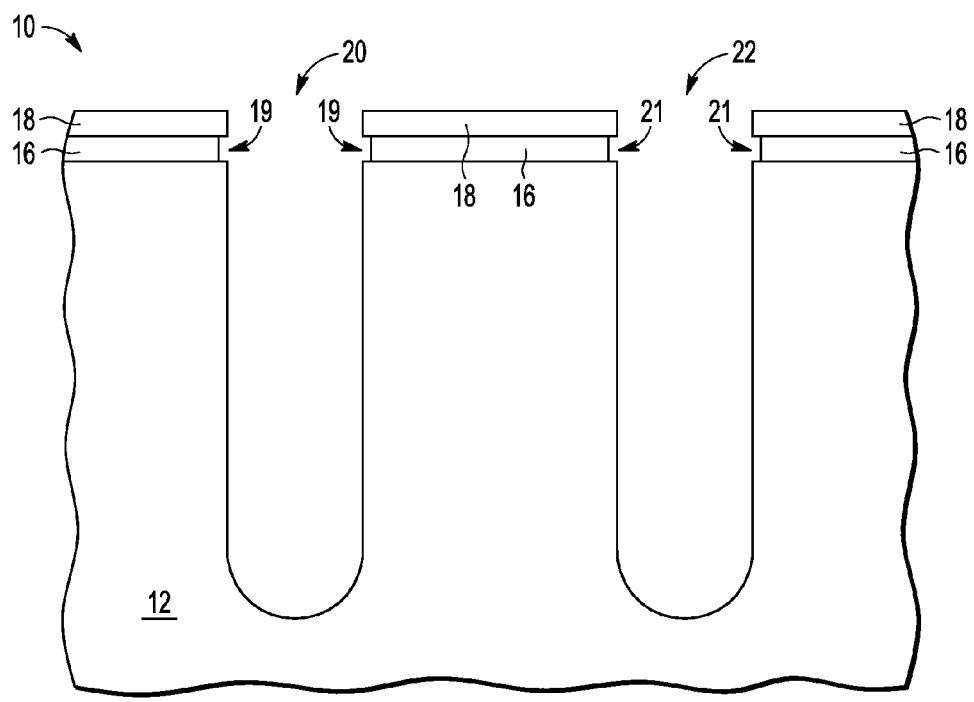
FIG. 4 illustrates, in cross-sectional form, the semiconductor device of FIG. 3 after removal of the sacrificial insulating layer to form an undercut region, in accordance with one embodiment of the present invention.

FIG. 4 illustrates, in cross-sectional form, semiconductor device 10 of FIG. 3 after removal of sacrificial insulating layers 15 and 17 to form undercut region 19 and 21, respectively, in accordance with one embodiment of the present invention. For example, in one embodiment, sacrificial insulating layers 15 and 17 are removed using an etchant that also laterally etches insulating layer 16 to leave undercut region 19 in opening 20 between semiconductor layer 12 and insulating layer 18 and undercut region 21 in opening 22 between semiconductor layer 12 and insulating layer 18. That is, since insulating layer 16 and sacrificial layers 15 and 16 have the same first etch characteristic, they are both etched by the etchant, while not etching insulating layer 18. Note that undercut regions 19 and 21 are formed prior to formation of any gate dielectric layer within openings 20 and 22.

Figure 5:
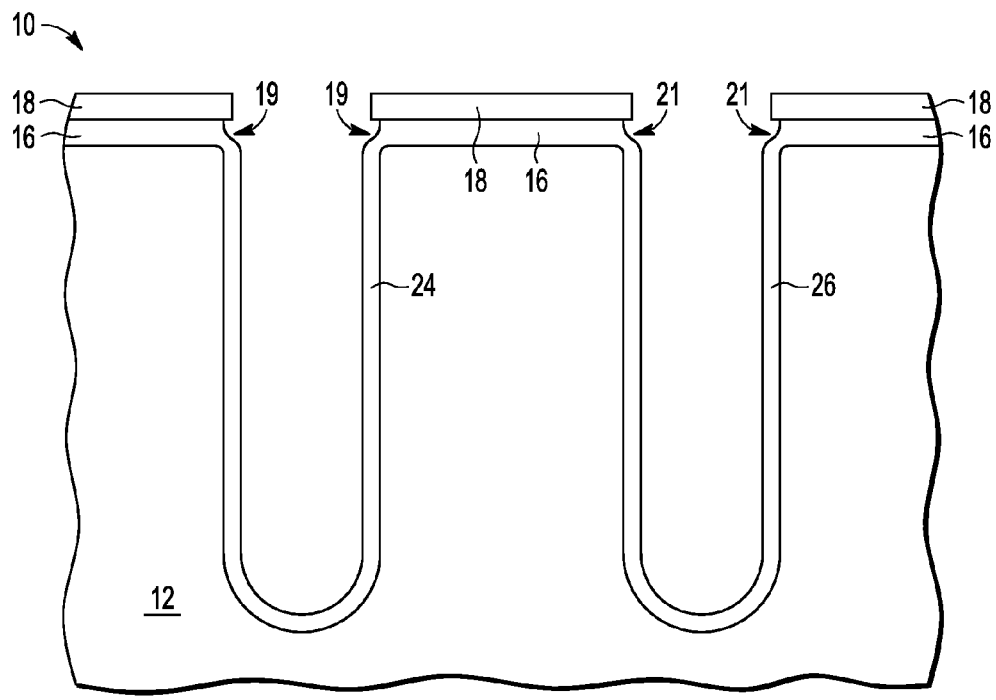
FIG. 5 illustrates, in cross-sectional form, the semiconductor device of FIG. 4 after formation of a gate dielectric layer in the openings, in accordance with one embodiment of the present invention.

FIG. 5 illustrates, in cross-sectional form, semiconductor device 10 of FIG. 4 after formation of gate dielectric layers 24 and 26 in openings 20 and 22, respectively, in accordance with one embodiment of the present invention. In one embodiment, each of gate dielectric layers 24 and 26 are oxides which are grown within openings 20 and 22, respectively, and the exposed sidewalls of insulating layer 16. Therefore, gate dielectric layers 24 and 26 are formed along the sidewalls and bottom of openings 20 and 22, respectively. Note that gate dielectric layers 24 and 26 may also be referred to as gate dielectrics. Each of gate dielectric layers 24 and 26 includes a vertical portion along a sidewall of each of openings 20 and 22, respectively, that extends to a top surface of semiconductor 12. (The top surface of semiconductor layer 12 corresponds to the surface on which insulating layer 16 is formed.) Also, note that, although some oxide may be formed on the exposed sidewalls of insulating layer 16 during the formation of gate dielectric layers 25 and 26, undercut regions 19 and 21 still remain between semiconductor layer 12 and insulating layer 18. That is, undercut regions 19 and 21 extend laterally away from the edges of openings 20 and 22, respectively, under insulating layer 18.

Figure 6:
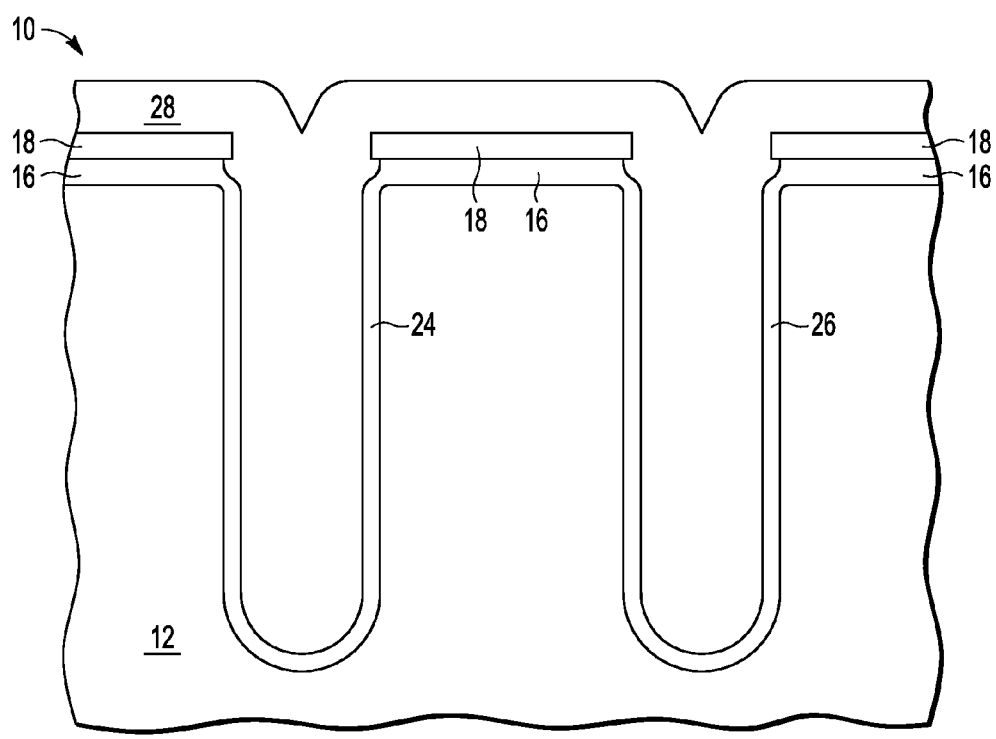
FIG. 6 illustrates, in cross-sectional form, the semiconductor device of FIG. 5 after formation of a first gate material layer, in accordance with one embodiment of the present invention.

FIG. 6 illustrates, in cross-sectional form, semiconductor device 10 of FIG. 5 after formation of a gate material layer 28, in accordance with one embodiment of the present invention. In one embodiment, gate material layer 28 is deposited over insulating layer 18, in openings 20 and 22, and in undercut regions 19 and 21. In one embodiment, gate material layer 28 is polysilicon. In one embodiment, gate material layer 28 is an in-situ doped polysilicon layer. Also, in one embodiment, deposition of gate material layer 28 in openings 20 and 22 may result in a seam (not shown) within each of opening 20 and/or opening 22. Also, in one embodiment, deposition of gate material layer 28 may include the deposition of a liner layer first.

Figure 7:
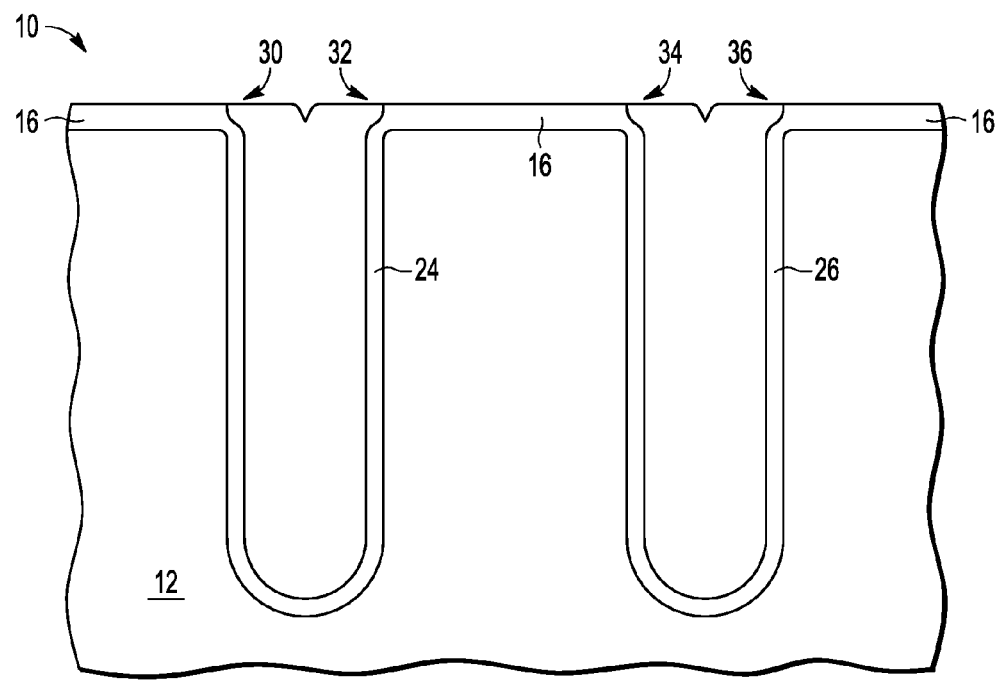
FIG. 7 illustrates, in cross-sectional form, the semiconductor device of FIG. 6 after etching back the first gate material layer and removal of the second insulating layer, in accordance with one embodiment of the present invention.

FIG. 7 illustrates, in cross-sectional form, semiconductor device 10 of FIG. 6 after etching back gate material layer 28 and removal of the second insulating layer 18, in accordance with one embodiment of the present invention. In one embodiment, the etching back of gate material layer 28 leaves a first portion of gate material in each of openings 20 and 22 and leaves a second portion of gate material in undercut regions 19 and 21. The second portion of gate material which remains in each of undercut regions 19 and 21 result in overhang portions 30 and 32 (which correspond to opening 20) and overhang portions 34 and 36 (which correspond to opening 22). Note that overhang portions 30 and 32 extend laterally over the vertical portions of gate dielectric layer 24, and overhang portions 34 and 36 extend laterally over the vertical portions of gate dielectric layer 26. Also, overhang portions 30, 32, 34, and 36 may extend over a portion of the top surface of semiconductor layer 12.

Figure 8:
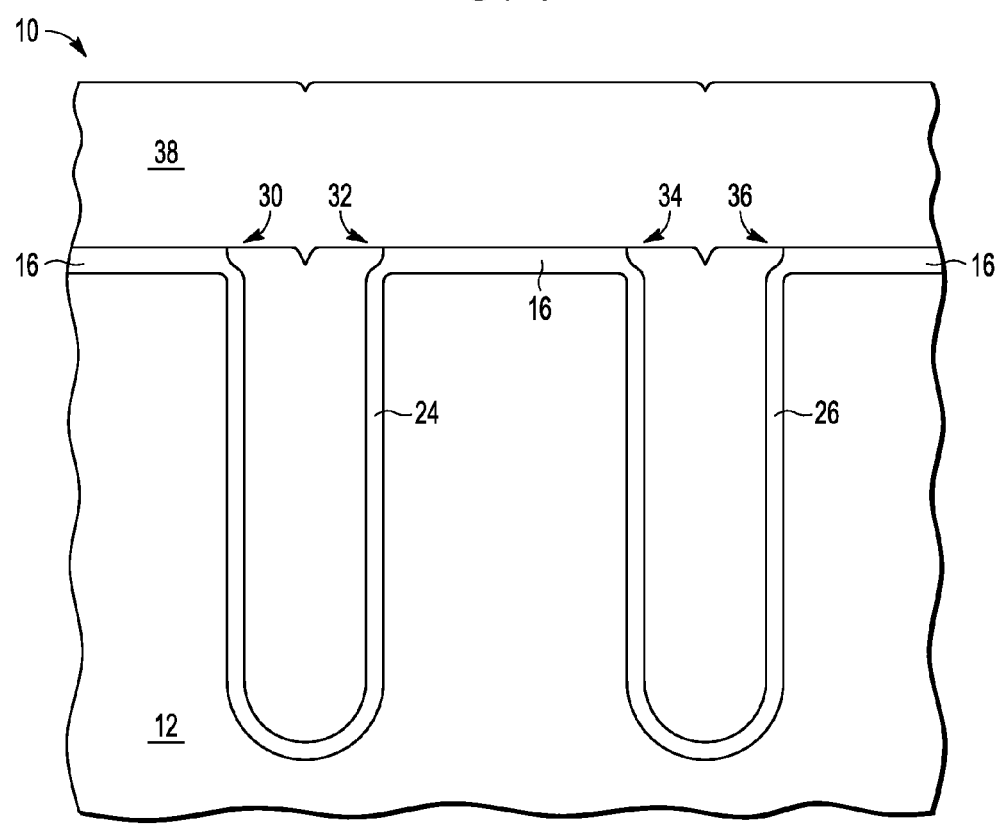
FIG. 8 illustrates, in cross-sectional form, the semiconductor device of FIG. 7, after formation of a second gate material layer, in accordance with one embodiment of the present invention.

FIG. 8 illustrates, in cross-sectional form, semiconductor device 10 of FIG. 7, after formation of a gate material layer 38, in accordance with one embodiment of the present invention. In one embodiment, gate material layer 38 is deposited over etched-back gate material layer 28. In one embodiment, gate material layer 38 is also polysilicon. In one embodiment, gate material layer 38 is an undoped polysilicon layer.

Figure 9:
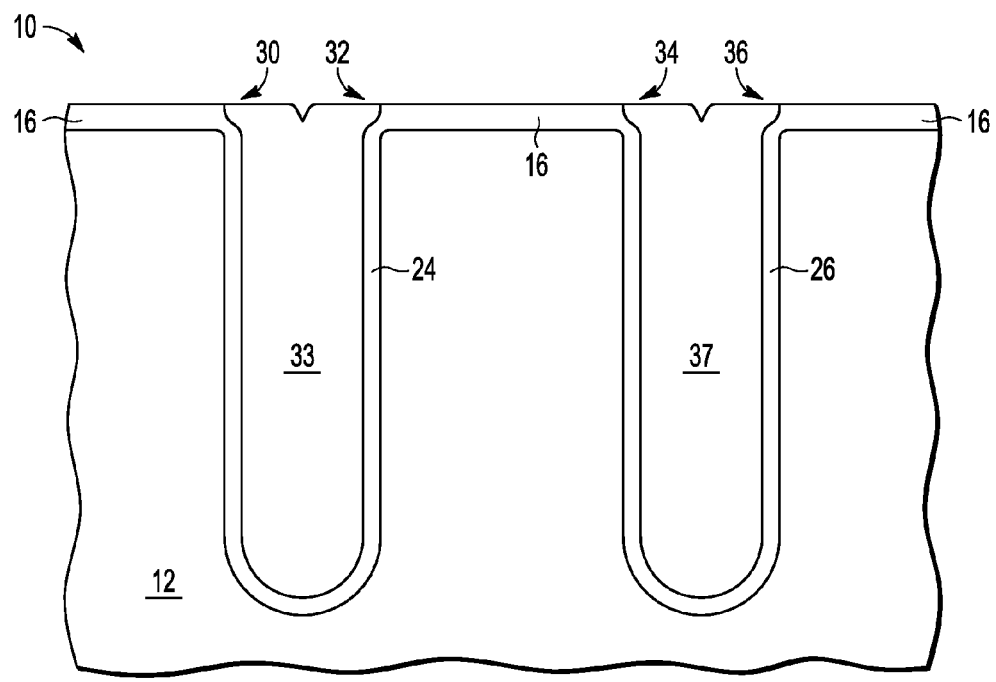
FIG. 9 illustrates, in cross-sectional form, the semiconductor device of FIG. 8 after etching back the second gate material layer, in accordance with one embodiment of the present invention.

FIG. 9 illustrates, in cross-sectional form, semiconductor device 10 of FIG. 8 after etching back gate material layer 38, in accordance with one embodiment of the present invention. In one embodiment, the etching back of gate material 38 includes performing an initial etch at a first etch rate (which, in one embodiment, performs at least 90 percent of the etch back of gate material 38) followed by a subsequent etch at a second etch rate that is slower than the first etch rate. In this manner, the stopping of the etch back of gate material 38 may be better controlled such that the overhang portions are not removed or adversely affected. Therefore, after etching back of gate material layer 38, overhang portions 30, 32, 34, and 36 still remain extending laterally over the vertical portions of gate dielectric layers 24 and 26. The remaining portion of gate material within opening 20 and overhang portions 30 and 32 may be referred to collectively as gate 33, and the remaining portion of gate material within opening 22 and overhang portions 34 and 36 may be referred to collectively as gate 37. Note that, in one embodiment, second gate material 38 provides for a gate feed connection, a polysilicon diode making material and a polysilicon resistor making material.

Note that each of gates 33 and 37 include a major portion of the gate (corresponding to the portion within opening 20 and 22, respectively) and a lateral portion (corresponding to the overhang portions). In an alternate embodiment, gates 33 and 37 may be formed in different ways. For example, after formation of gate dielectric 24 and 26, a layer of gate material can be deposited over semiconductor layer 12 and within openings 20 and 22. This layer of gate material can then be patterned to leave portions of the layer of gate material which correspond to gates 33 and 37, where each gate includes both a major portion of a gate and a lateral portion of a gate.

Figure 10:
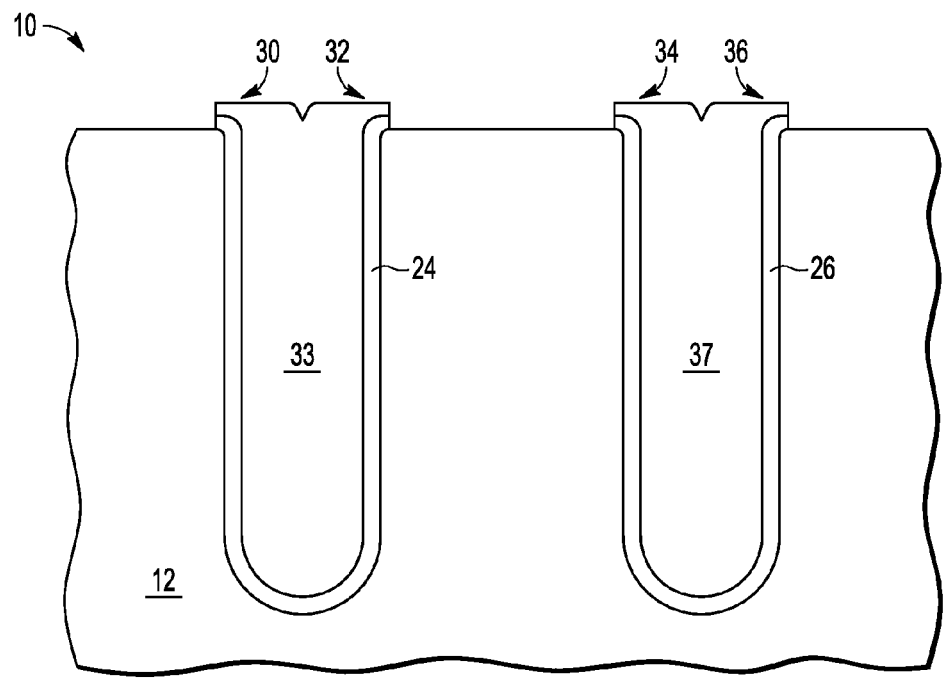
FIG. 10 illustrates, in cross-sectional form, the semiconductor device of FIG. 9 after removal of the first insulating layer over the semiconductor layer, in accordance with one embodiment of the present invention.

FIG. 10 illustrates, in cross-sectional form, semiconductor device 10 of FIG. 9 after removal of the insulating layers 16 and 18, in accordance with one embodiment of the present invention. In one embodiment, insulating layers 16 and 18 are etched to expose semiconductor layer 12.

Figure 11:
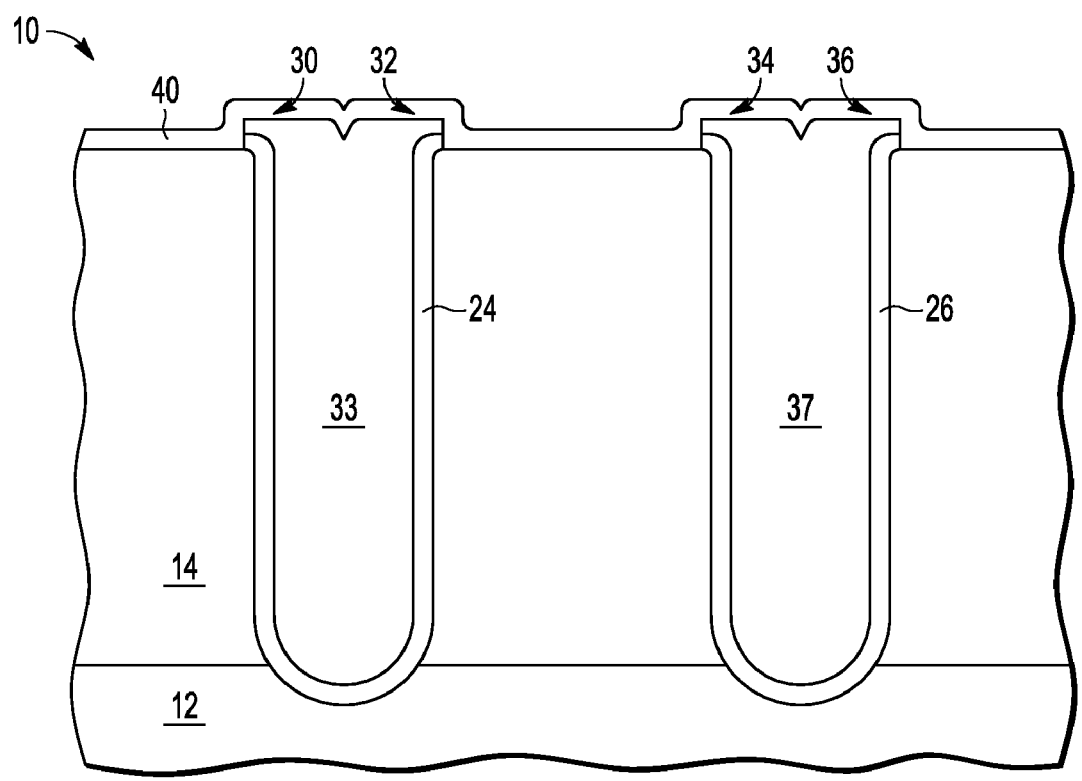
FIG. 11 illustrates, in cross-sectional form, the semiconductor device of FIG. 10 after formation of a third insulating layer and performing a first implant into the semiconductor layer, in accordance with one embodiment of the present invention.

FIG. 11 illustrates, in cross-sectional form, semiconductor device 10 of FIG. 10 after formation of an insulating layer 40 and performing a first implant into semiconductor layer 12, in accordance with one embodiment of the present invention. In one embodiment, insulating layer 40 is grown on semiconductor layer 12 and on exposed portions of gate dielectric layers 24 and 26 and of gates 33 and 37. In one embodiment, insulating layer 40 is an oxide layer. After formation of insulating layer 40, an implant is performed which converts a top portion 14 of semiconductor layer 12 to a conductivity type which is opposite to a conductivity type of the source region to later be formed in top portion 14 of semiconductor layer 12. In one embodiment, insulating layer 40 protects gates 33 and 37 during the implant. In one embodiment, the implant is a p-type implant and resulting top portion 14 may be referred to as a body layer which is formed within semiconductor layer 12. Note that body layer 14 extends to a depth in semiconductor layer 12 which does not extend below the bottoms of gates 33 and 37. That is, note that body layer 14 extends to a first depth into semiconductor layer 12 and openings 20 and 22 extend to a second depth into semiconductor layer 12, where the second depth is greater than the first depth.

Figure 12:
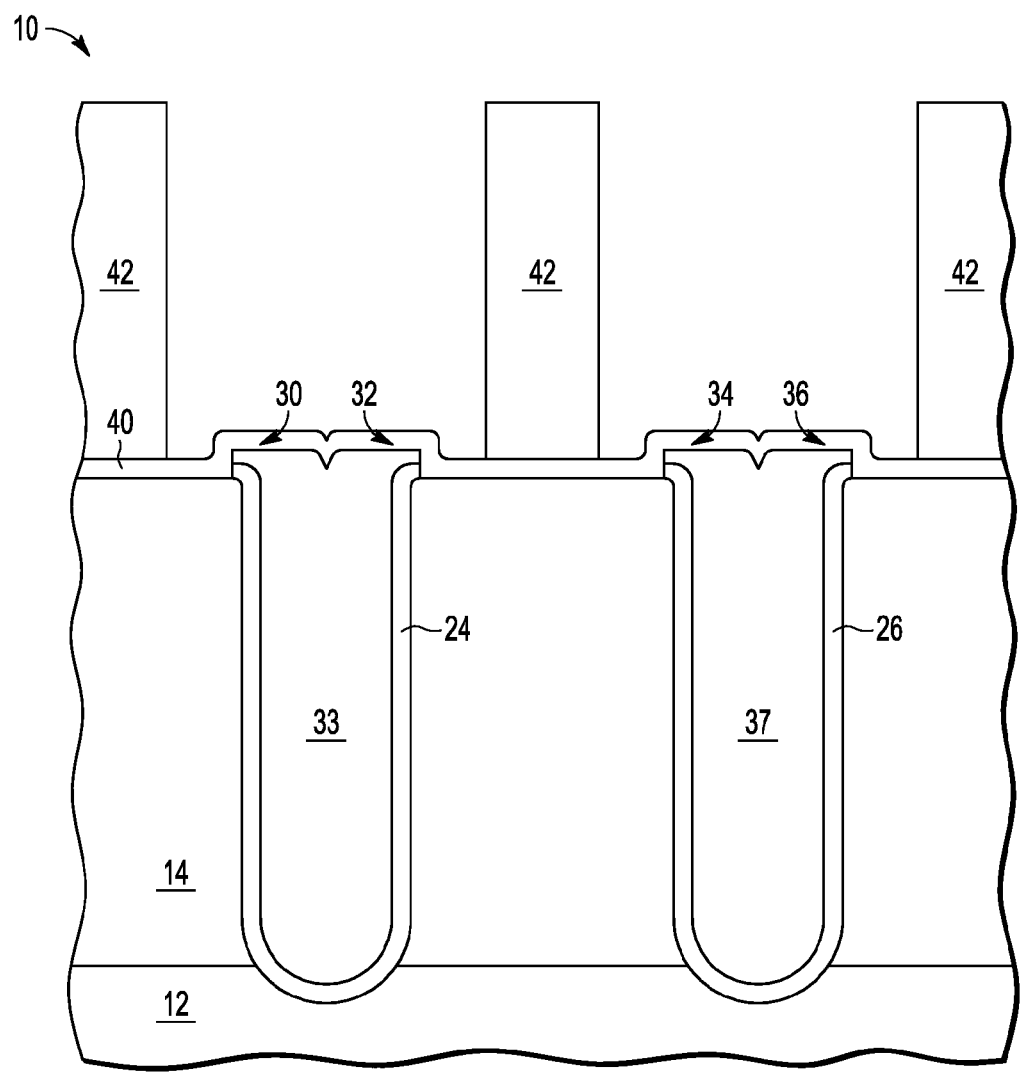
FIG. 12 illustrates, in cross-sectional form, the semiconductor device of FIG. 11 after formation of a first patterned masking layer, in accordance with one embodiment of the present invention.

FIG. 12 illustrates, in cross-sectional form, semiconductor device 10 of FIG. 11 after formation of a patterned masking layer 42, in accordance with one embodiment of the present invention. In one embodiment, patterned masking layer defines where the source regions will be formed, in body layer 14, adjacent gates 33 and 37.

Figure 13:
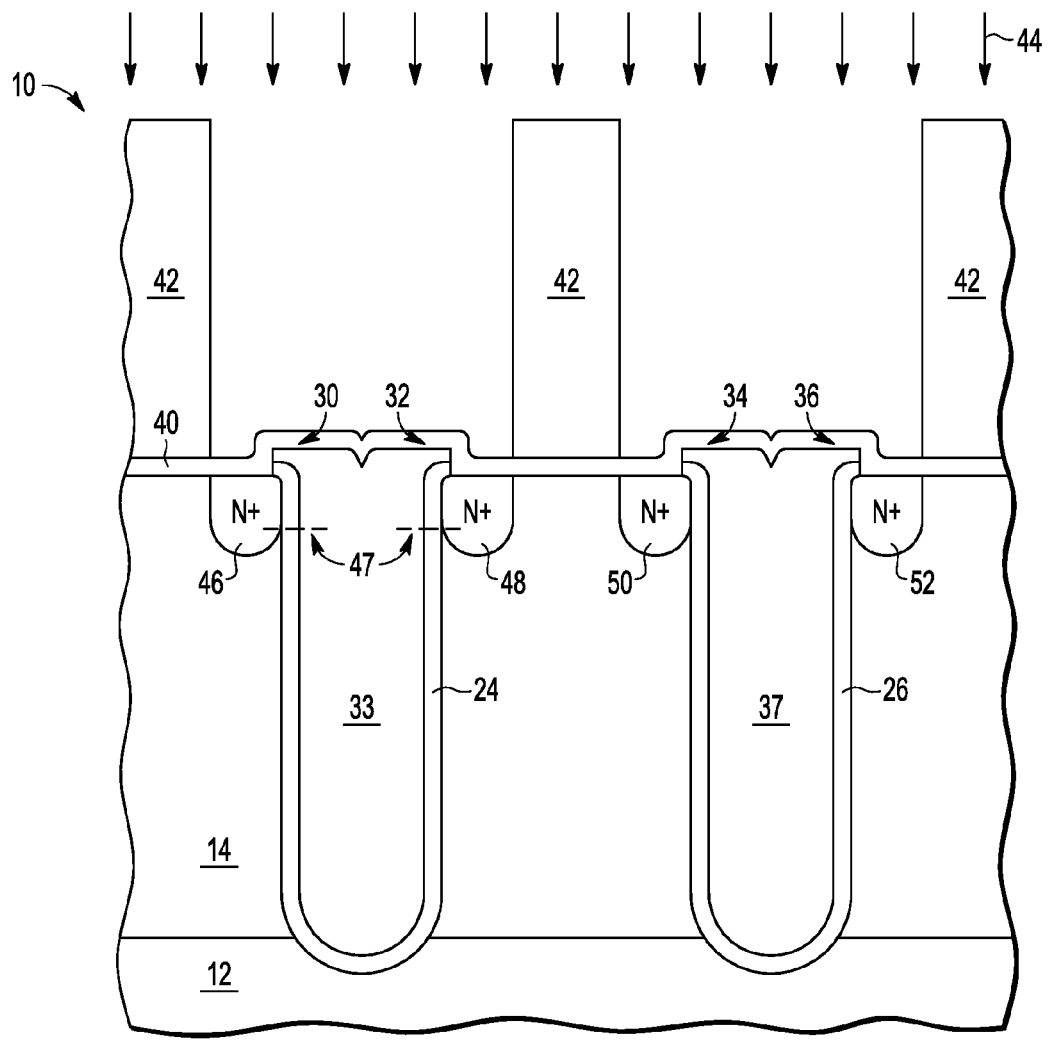
FIG. 13 illustrates, in cross-sectional form, the semiconductor device of FIG. 12 after performing a second implant into the semiconductor layer, in accordance with one embodiment of the present invention.

FIG. 13 illustrates, in cross-sectional form, semiconductor device 10 of FIG. 12 after performing a source implant 44 into body layer 14, in accordance with one embodiment of the present invention. In one embodiment, source implant 44 is performed to form a source region 46 and a source region 48 in body layer 14 adjacent each side of gate 33 and to form a source region 50 and a source region 52 in body layer 14 adjacent each side of gate 37. The conductivity type of the source regions is opposite that of the body layer. In one embodiment, source regions 46, 48, 50, and 52 are N+ type. Patterned masking layer 42 is then removed after implant 44.

Note that during implant 44, overhang portions 30, 32, 34, and 36 act as masks which reduce a depth of implant 44 into the gate dielectric layers under the overhang portions. That is, as seen in FIG. 13, implant 44 extends to a depth 47 into the vertical portions of gate dielectric 24. This may allow for the formation of a shallower resulting source region after subsequent processing of semiconductor 10 to form a completed device. For example, without overhang portions 30 and 32 present, source implant 44 would extend to a depth further into gate dielectric layer 24 than depth 47, thus resulting in a deeper source region. This may, in turn, result in a reduced energy capability of the device.

Figure 14:
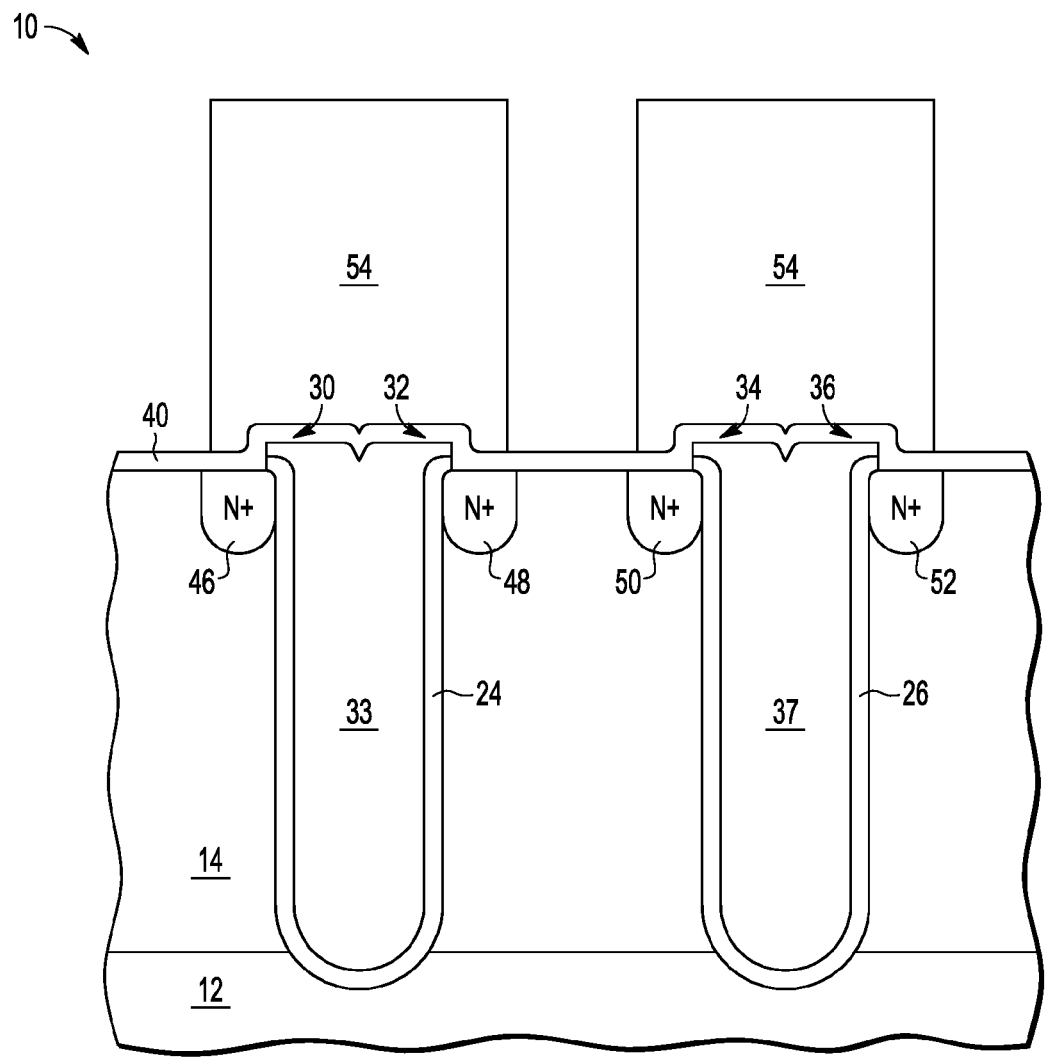
FIG. 14 illustrates, in cross-sectional form, the semiconductor device of FIG. 13 after formation of a second patterned masking layer, in accordance with one embodiment of the present invention

FIG. 14 illustrates, in cross-sectional form, semiconductor device 10 of FIG. 13 after formation of a patterned masking layer 54, in accordance with one embodiment of the present invention. In one embodiment, patterned masking layer 54 defines where the body contact regions will be formed in body layer 14, between adjacent gates.

Figure 15:
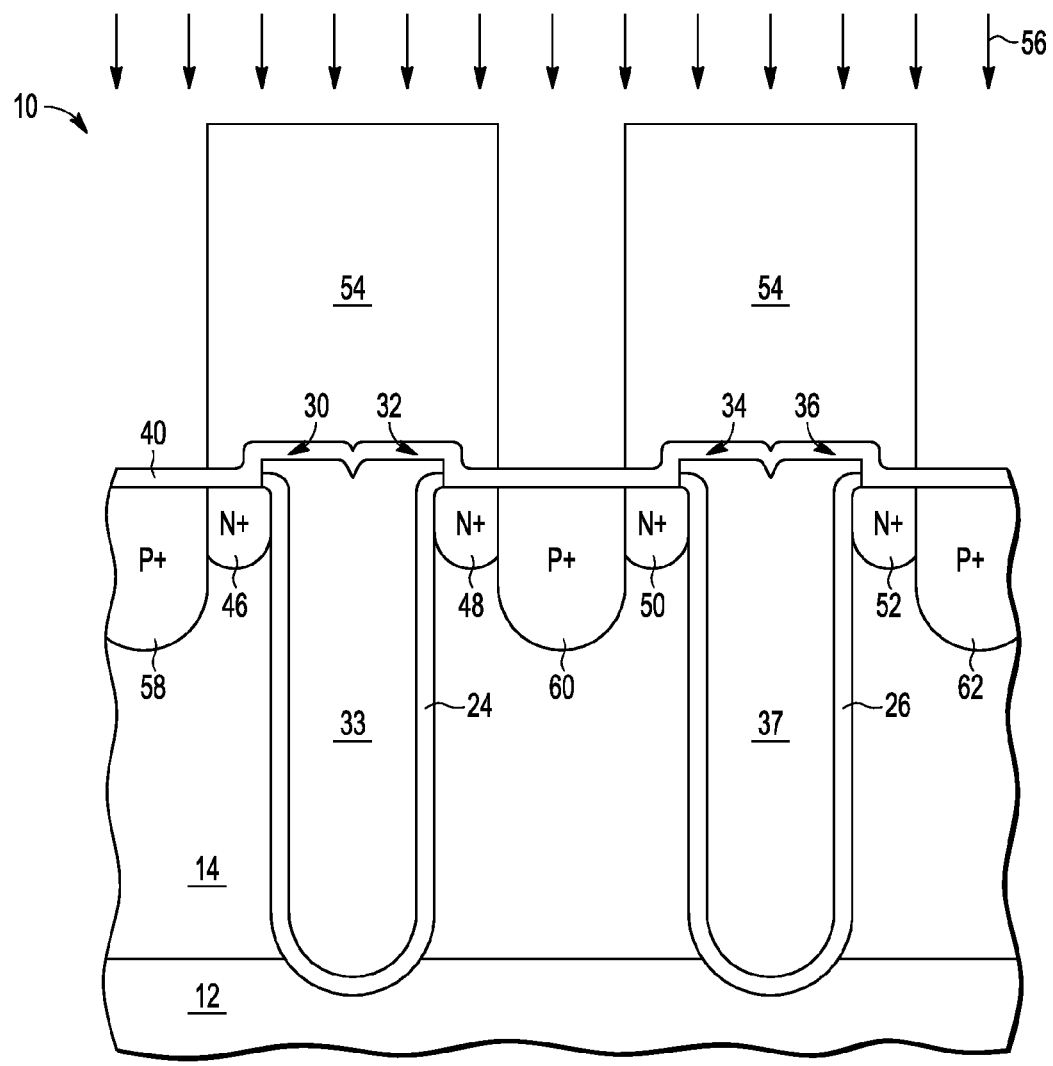
FIG. 15 illustrates, in cross-sectional form, the semiconductor device of FIG. 14 after performing a third implant into the semiconductor layer, in accordance with one embodiment of the present invention.

FIG. 15 illustrates, in cross-sectional form, semiconductor device 10 of FIG. 14 after performing an implant 56 into body layer 14, in accordance with one embodiment of the present invention. In one embodiment, implant 56 is performed to form body contact regions 58, 60, and 62 in body layer 14 between source regions of adjacent gates. For example, body contact region 60 is formed between source region 48 corresponding to gate 33 and source region 50 corresponding to gate 37. In one embodiment, body contact regions 58, 60, and 62 are of the same conductivity type as the body layer. In one embodiment, the conductivity type of the body contact regions is P+.

Figure 16:
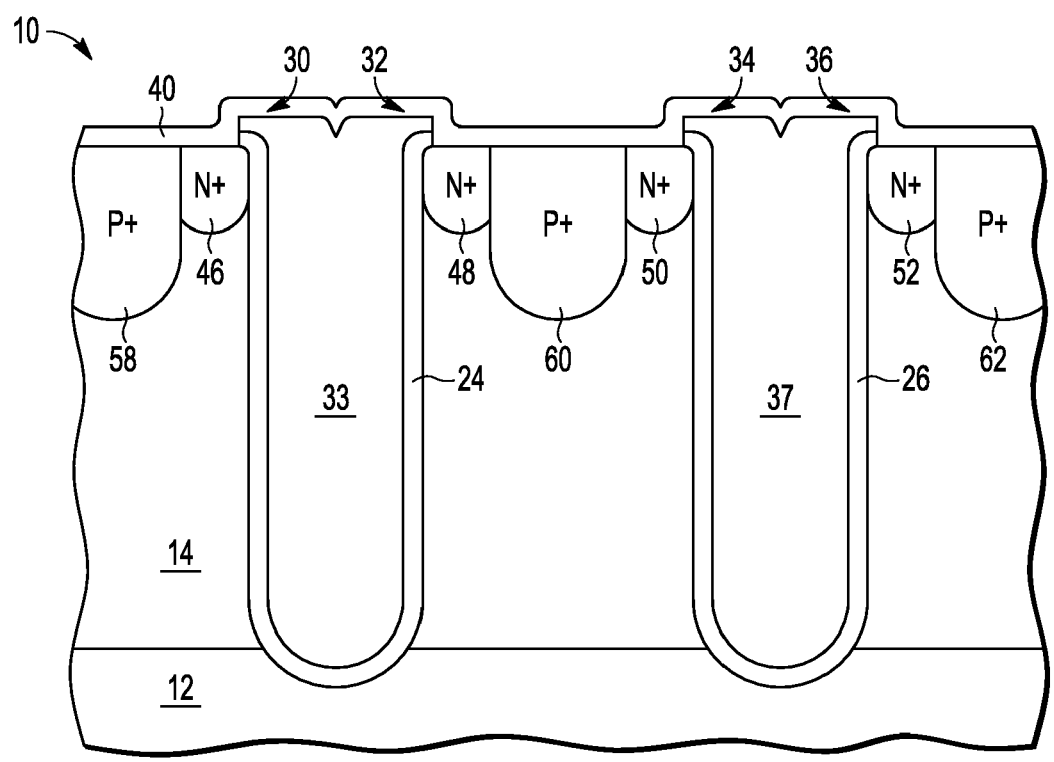
FIG. 16 illustrates, in cross-sectional form, the semiconductor device of FIG. 15, after removal of the second patterned masking layer, in accordance with one embodiment of the present invention.

FIG. 16 illustrates, in cross-sectional form, semiconductor device 10 of FIG. 15, after removal of patterned masking layer 54, in accordance with one embodiment of the present invention. Further semiconductor processing, as known in the art, may then be performed to complete the vertical devices. This further processing may cause segregation and diffusion effects; however, due to the protection offered by the overhang portions during the source implant, a shallower source region results in the final device as compared to the source regions in typical trench transistors. These shallower source regions may therefore allow for improved robustness and energy capability.

By now it should be appreciated that there has been provided a process for forming vertical MOS transistors with improved robustness and energy capability. For example, in one embodiment, gates are formed within openings or trenches which include both a major portion and overhang portions which extend laterally over the vertical portions of the gate dielectrics. These overhang portions mask the source implant, thus controlling the depth of the source implant into the vertical portions of the gate dielectrics. As a result, shallower source regions may result, which may allow for improved vertical MOS devices.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different processes may be used to form the overhang portions of the gates. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of forming a vertical MOS transistor using a semiconductor layer including etching an opening in the semiconductor layer; forming a gate dielectric in the opening that has a vertical portion that extends to a top surface of the first semiconductor layer; forming a gate in the opening having a major portion laterally adjacent to the vertical portion of the gate dielectric and an overhang portion that extends laterally over the vertical portion of the gate dielectric; and performing an implant to form a source region at the top surface of the semiconductor layer while the overhang portion is present. Item 2 include the method of item 1, and further includes forming a first insulating layer on the semiconductor layer prior to the step of etching, wherein the first insulating layer has a first etch characteristic; and forming a second insulating layer on the first insulating layer prior to the step of etching, wherein the step of etching forms an opening in the first insulating layer and the second insulating layer aligned to the opening in the semiconductor layer. Item 3 includes the method of item 2 and further includes forming a third insulating layer in the opening in the semiconductor layer having the first etch characteristic; and removing the third insulating layer using an etchant that laterally etches the first insulating layer to leave an undercut region between the first semiconductor layer and the second insulating layer prior to forming the gate dielectric. Item 4 includes the method of item 3, wherein the step of forming the gate comprises depositing a first gate material layer in the first opening and in the undercut. Item 5 includes the method of item 4, wherein the step of forming the gate further comprises etching back the first gate material layer while leaving at least a first portion of the first gate material layer that was in the opening in the semiconductor layer and a second portion of the first gate material in the undercut, and wherein the second portion of the first gate material layer comprises at least a portion of the overhang portion. Item 6 includes the method of item 5, and further includes removing the second insulating layer after the step of etching back the first gate material layer. Item 7 includes the method of item 5, wherein the step of forming the gate further includes depositing a second gate material layer over the first gate material layer after the step of etching back the first gate material layer; and etching back the second layer of gate material. Item 8 includes the method of item 7, and further includes removing the first insulating layer after the step of etching back the second layer of gate material. Item 9 includes the method of item 5, and further includes performing an implant to convert a top portion of the semiconductor layer to a first conductivity type, wherein the source is a second conductivity type. Item 10 includes the method of item 9, wherein the step of performing the implant to convert is further characterized by the implant being to a first depth in the semiconductor layer; and the step of etching the opening in the semiconductor layer is to a second depth in the semiconductor layer, wherein the second depth is greater than the first depth. Item 11 includes the method of item 1, wherein the overhang portion extends over a portion of a top surface of the semiconductor layer. Item 12 includes the method of item 1, wherein the step of forming the gate includes depositing a layer of gate material over the semiconductor layer and in the opening; and patterning the layer of gate material to leave portions of the layer of gate material comprising the major portion of the gate and the lateral portion of the gate. Item 13 includes the method of item 1 and further includes forming a first oxide layer on the semiconductor layer prior to the step of etching; forming a nitride layer on the first oxide layer, wherein the step of etching forms an opening in the first oxide layer and the nitride layer aligned to the opening in the semiconductor layer; growing a second oxide layer in the opening in the semiconductor layer; and removing the second oxide layer using an etchant that laterally etches the first oxide layer to leave an undercut region between the first oxide layer and the nitride layer prior to forming the gate dielectric, wherein the step of forming the gate comprises depositing polysilicon in the opening in the semiconductor layer and in the undercut.

Item 14 includes a method of forming a vertical MOS transistor using a semiconductor layer, including forming a oxide layer on the semiconductor layer; forming a nitride layer on the oxide layer; etching an opening in the semiconductor layer, the first insulating layer, and the second insulating layer; growing a second oxide layer in the opening in the semiconductor layer; removing the second oxide layer using an etchant that laterally etches the first oxide layer to leave an undercut region between the semiconductor layer and the nitride layer; forming a gate dielectric in the opening; depositing gate material in the opening, in the undercut region, and over the nitride layer whereby the gate material is present in a region of the undercut region; etching back the gate material to leave a first portion of the gate material in the opening and a second portion of the gate material in the region of the undercut region; and performing an implant to form a source region at the top surface of the semiconductor layer using the second portion of the gate material as a mask. Item 15 includes the method of item 14 wherein the step of etching back includes performing an initial etch at a first rate; and performing a subsequent etch at a second rate slower than the first rate. Item 16 includes the method of item 15, wherein at least 90 percent of the step of etching back is performed by the initial etch. Item 17 includes the method of item 14, wherein the step of depositing gate material includes depositing polysilicon which is followed by performing an etch back which is followed by a deposition of polysilicon. Item 18 includes the method of item 14 and further includes implanting into the semiconductor to a depth in the semiconductor layer less than a depth of the opening in the semiconductor layer of a conductivity type opposite to that of the source region.

Item 19 includes a method of forming a vertical MOS transistor using a semiconductor layer, including etching an opening in the semiconductor layer; forming a gate dielectric in the opening; forming a gate having a major portion in the opening and an overhang portion that is at a higher level than a top surface of the semiconductor layer and that extends laterally over at least a portion of the gate dielectric; and performing an implant to form a source region at the top surface of the semiconductor layer using the overhang portion as a mask that reduces a depth of the implant into the gate dielectric under the overhang portion. Item 20 includes the method of item 20, wherein the overhang portion is formed by filling with polysilicon an undercut of an oxide layer formed on a top surface of the semiconductor layer.

What is claimed is:
1. A method of forming a vertical MOS transistor using a semiconductor layer, comprising:
etching an opening in the semiconductor layer;
forming a gate dielectric in the opening that has a vertical portion that extends to a top surface of the semiconductor layer;

forming a gate in the opening having a major portion laterally adjacent to the vertical portion of the gate dielectric and an overhang portion that extends laterally over the vertical portion of the gate dielectric;

performing an implant to form a source region at the top surface of the semiconductor layer while the overhang portion is present; and forming a third insulating layer in the opening in the semiconductor layer having the first etch characteristic; and removing the third insulating layer using an etchant that laterally etches the first insulating layer to leave an undercut region between the first semiconductor layer and the second insulating layer prior to forming the gate dielectric.

2. The method of claim 1, further comprising:

forming a first insulating layer on the semiconductor layer prior to the step of etching, wherein the first insulating layer has a first etch characteristic; and forming a second insulating layer on the first insulating layer prior to the step of etching, wherein the step of etching forms an opening in the first insulating layer and the second insulating layer aligned to the opening in the semiconductor layer.

3. The method of claim 1, wherein the step of forming the gate comprises depositing a first gate material layer in the first opening and in the undercut.

4. The method of claim 3 wherein the step of forming the gate further comprises etching back the first gate material layer while leaving at least a first portion of the first gate material layer that was in the opening in the semiconductor layer and a second portion of the first gate material in the undercut, wherein the second portion of the first gate material layer comprises at least a portion of the overhang portion.

5. The method of claim 4, further comprising removing the second insulating layer after the step of etching back the first gate material layer.

6. The method of claim 4, wherein the step of forming the gate further comprises:

depositing a second gate material layer over the first gate material layer after the step of etching back the first gate material layer; and etching back the second layer of gate material.

7. The method of claim 6, further comprising removing the first insulating layer after the step of etching back the second layer of gate material.

8. The method of claim 4, further comprising:

performing an implant to convert a top portion of the semiconductor layer to a first conductivity type, wherein the source is a second conductivity type.

9. The method of claim 8, wherein:

the step of performing the implant to convert is further characterized by the implant being to a first depth in the semiconductor layer; and the step of etching the opening in the semiconductor layer is to a second depth in the semiconductor layer, wherein the second depth is greater than the first depth.

10. The method of claim 1, wherein the overhang portion extends over a portion of a top surface of the semiconductor layer.

11. The method of claim 1 wherein the step of forming the gate comprises:

depositing a layer of gate material over the semiconductor layer and in the opening; and patterning the layer of gate material to leave portions of the layer of gate material comprising the major portion of the gate and the lateral portion of the gate.

12. A method of forming a vertical MOS transistor using a semiconductor layer, comprising:

etching an opening in the semiconductor layer;

forming a gate dielectric in the opening that has a vertical portion that extends to a top surface of the semiconductor layer;

forming a gate in the opening having a major portion laterally adjacent to the vertical portion of the gate dielectric and an overhang portion that extends laterally over the vertical portion of the gate dielectric;

performing an implant to form a source region at the top surface of the semiconductor layer while the overhang portion is present;

forming a first oxide layer on the semiconductor layer prior to the step of etching;

forming a nitride layer on the first oxide layer, wherein the step of etching forms an opening in the first oxide layer and the nitride layer aligned to the opening in the semiconductor layer;

growing a second oxide layer in the opening in the semiconductor layer; and removing the second oxide layer using an etchant that laterally etches the first oxide layer to leave an undercut region between the first oxide layer and the nitride layer prior to forming the gate dielectric; and wherein the step of forming the gate comprises depositing polysilicon in the opening in the semiconductor layer and in the undercut.

13. A method of forming a vertical MOS transistor using a semiconductor layer, comprising:

forming a oxide layer on the semiconductor layer;

forming a nitride layer on the oxide layer;

etching an opening in the semiconductor layer, the first insulating layer, and the second insulating layer;

growing a second oxide layer in the opening in the semiconductor layer;

removing the second oxide layer using an etchant that laterally etches the first oxide layer to leave an undercut region between the semiconductor layer and the nitride layer;

forming a gate dielectric in the opening;

depositing gate material in the opening, in the undercut region, and over the nitride layer whereby the gate material is present in a region of the undercut region;

etching back the gate material to leave a first portion of the gate material in the opening and a second portion of the gate material in the region of the undercut region; and performing an implant to form a source region at the top surface of the semiconductor layer using the second portion of the gate material as a mask.

14. The method of claim 13 wherein the step of etching back comprises:

performing an initial etch at a first rate; and performing a subsequent etch at a second rate slower than the first rate.

15. The method of claim 14, wherein at least 90 percent of the step of etching back is performed by the initial etch.

16. The method of claim 13, wherein the step of depositing gate material comprises depositing polysilicon which is followed by performing an etch back which is followed by a deposition of polysilicon.

17. The method of claim 13 further comprising implanting into the semiconductor to a depth in the semiconductor layer less than a depth of the opening in the semiconductor layer of a conductivity type opposite to that of the source region.

18. A method of forming a vertical MOS transistor using a semiconductor layer, comprising:

etching an opening in the semiconductor layer;
forming a gate dielectric in the opening;
forming a gate having a major portion in the opening and an overhang portion that is at a higher level than a top surface of the semiconductor layer and that extends laterally over at least a portion of the gate dielectric; and
performing an implant to form a source region at the top surface of the semiconductor layer using the overhang portion as a mask that reduces a depth of the implant into the gate dielectric under the overhang portion,
wherein the overhang portion is formed by filling with polysilicon an undercut of an oxide layer formed on a top surface of the semiconductor layer.

* * * * *